US012133012B2

(12) United States Patent
Park et al.

(10) Patent No.: US 12,133,012 B2
(45) Date of Patent: Oct. 29, 2024

(54) IMAGE SENSOR AND METHOD OF OPERATING THE IMAGE SENSOR

(71) Applicant: SK hynix Inc., Icheon-si Gyeonggi-do (KR)

(72) Inventors: Yu Jin Park, Icheon-si Gyeonggi-do (KR); Han Sol Park, Icheon-si Gyeonggi-do (KR)

(73) Assignee: SK hynix inc., Icheon-si (KR)

( * ) Notice: Subject to any disclaimer, the term of this patent is extended or adjusted under 35 U.S.C. 154(b) by 78 days.

(21) Appl. No.: 17/982,952

(22) Filed: Nov. 8, 2022

(65) Prior Publication Data

US 2023/0421926 A1 Dec. 28, 2023

(30) Foreign Application Priority Data

May 20, 2022 (KR) .................. 10-2022-0062340

(51) Int. Cl.
*H04N 25/778* (2023.01)
*H01L 27/146* (2006.01)
*H04N 25/78* (2023.01)

(52) U.S. Cl.
CPC .................. *H04N 25/778* (2023.01)

(58) Field of Classification Search
CPC ...... H04N 25/778; H04N 25/78; H04N 25/77; H04N 25/75; H01L 27/14609; H01L 27/14603; H01L 27/14612; H01L 27/14641
See application file for complete search history.

(56) References Cited

U.S. PATENT DOCUMENTS

| 7,304,674 | B2* | 12/2007 | Mentzer | H04N 25/00 348/241 |
| 10,887,538 | B2* | 1/2021 | Zhu | H04N 25/75 |
| 2013/0256510 | A1* | 10/2013 | Lyu | H04N 25/585 250/206 |

FOREIGN PATENT DOCUMENTS

| KR | 101900273 B1 | 9/2018 |
| KR | 1020190012659 A | 2/2019 |

* cited by examiner

*Primary Examiner* — Ahmed A Berhan
(74) *Attorney, Agent, or Firm* — WILLIAM PARK & ASSOCIATES LTD.

(57) ABSTRACT

The present technology relates to an image sensor. The image sensor according to an embodiment may include a pixel array in which a plurality of pixels are connected through common lines, an internal amplifier configured to amplify a signal of a target pixel selected from among the plurality of pixels, switches configured to control a connection between the target pixel and floating diffusion nodes of candidate pixels having the same column address as the target pixel among the plurality of pixels, and a controller configured to output control signals for controlling the switches.

19 Claims, 6 Drawing Sheets

IMAGE SENSOR AND METHOD OF OPERATING THE IMAGE SENSOR

CROSS-REFERENCE TO RELATED APPLICATION

The present application claims priority under 35 U.S.C. § 119(a) to Korean patent application number 10-2022-0062340 filed on May 20, 2022, in the Korean Intellectual Property Office, the entire disclosure of which is incorporated by reference herein.

BACKGROUND

1. Technical Field

The present disclosure relates to an image sensor, and more particularly, to an image sensor and a method of operating the image sensor.

2. Related Art

Generally, an image sensor may be divided into a charge coupled device (CCD) image sensor and a complementary metal oxide semiconductor (CMOS) image sensor. Recently, a CMOS image sensor that is inexpensive to manufacture, consumes little power, and is easy to integrate with a peripheral circuit has been attracting attention.

An image sensor included in a smart phone, a tablet PC, a digital camera, or the like may convert light reflected from an external object into an electrical signal, to obtain image information on the external object. The image sensor may include an internal amplifier for amplifying a pixel signal in preparation for a low-light environment.

The internal amplifier amplifies and outputs a signal received from a pixel. A gain value of the internal amplifier is determined during a manufacturing process. In order to use the image sensor in an environment in addition to the low-light environment, the gain value of the internal amplifier is required to be adjusted.

SUMMARY

According to an embodiment of the present disclosure, an image sensor may include a pixel array in which a plurality of pixels are connected through common lines, an internal amplifier configured to amplify a signal of a target pixel selected from among the plurality of pixels, switches configured to control a connection between a floating diffusion node of the target pixel and respective floating diffusion nodes of candidate pixels having the same column address as the target pixel among the plurality of pixels, and a controller configured to output control signals for controlling the switches. The candidate pixels may be positioned on the same common line as the target pixel According to an embodiment of the present disclosure, an image sensor may include pixels including a photo sensor configured to generate a photo charge based on received light, an input transistor generating a signal based on the photo charge, and a floating diffusion node connecting the photo sensor and the input transistor, an internal amplifier configured to amplify signals of the pixels, switches configured to connect between floating diffusion nodes of candidate pixels having the same column address among the pixels, and a controller configured to determine a target pixel from which a signal is output from among the pixels and at least one or more dummy pixels to which the floating diffusion node is connected, and adjust a gain value of the internal amplifier.

According to an embodiment of the present disclosure, a method of operating an image sensor may include determining a dummy pixel whose floating diffusion node is connected to a floating diffusion node of a target pixel outputting a signal among pixels included in a pixel array, outputting a control signal for operating a switch connected to the dummy pixel, and outputting a signal of a first composite pixel to which the target pixel and the dummy pixel are connected.

DETAILED DESCRIPTION

Specific structural or functional descriptions of embodiments according to the concept which are disclosed in the present specification or application are illustrated to describe the embodiments according to the concept of the present disclosure. The embodiments according to the concept of the present disclosure may be carried out in various forms and the descriptions are not limited to the embodiments described in the present specification or application. It will be understood that when an element, node, or transistor etc., is referred to as being "connected to" or "coupled to" another element, node, or transistor etc., it can be directly connected or coupled to the other element, node, or transistor etc., or intervening element, node, or transistor etc., may be present. In contrast, when an element, node, or transistor etc., is referred to as being "directly connected to" or "directly coupled to" another element, node, or transistor etc., there are no intervening element, node, or transistor etc., present.

Hereinafter, embodiments of the present disclosure are described with reference to the accompanying drawings.

An embodiment of the present disclosure provides an image sensor and a method of operating the image sensor which adjusts a gain value of an internal amplifier by connecting a target pixel and a dummy pixel in parallel.

According to the present technology, in an embodiment, an image sensor capable of adjusting a gain value of an internal amplifier by changing an input capacitance value of an already manufactured pixel may be provided.

Figure 1:
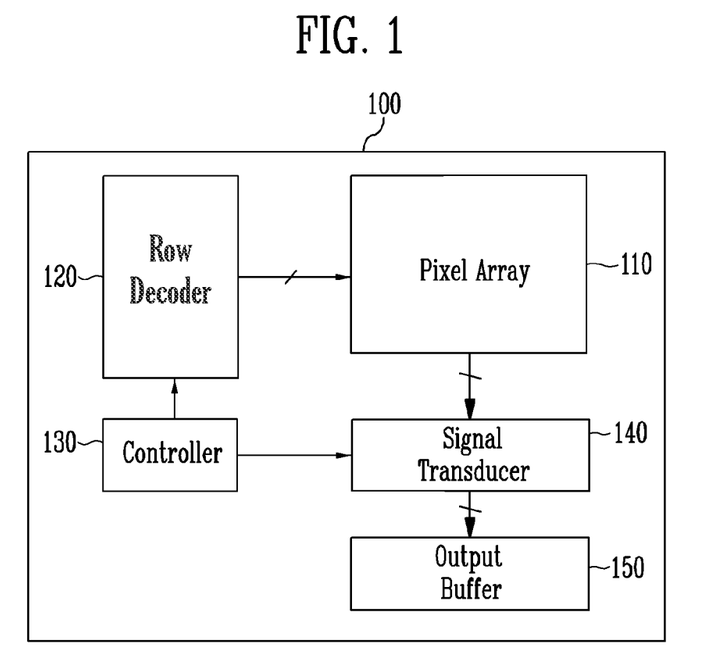
FIG. 1 is a diagram illustrating an image sensor according to an embodiment of the present disclosure.

FIG. 1 is a diagram illustrating an image sensor according to an embodiment of the present disclosure.

Referring to FIG. 1, the image sensor 100 may include a pixel array 110, a row decoder 120, a controller 130, a signal transducer 140, and an output buffer 150.

The pixel array 110 may include a plurality of pixels for outputting color information included in incident light. Specifically, each of the plurality of pixels may accumulate photo charges generated according to the incident light and generate a pixel signal corresponding to the accumulated photo charges. Each of the pixel sensor unit cells or referred to herein as pixels may include a photoelectric conversion element (for example, a photo diode, a photo transistor, a photogate, or a pinned photodiode) that converts an optical signal into an electrical signal, and at least one transistor for processing a signal.

The pixels included in the pixel array 110 may be described in detail with reference to FIG. 2.

The pixel array 110 may include a plurality of pixels arranged in a row direction and a column direction. The pixel array 110 may generate a plurality of pixel signals for each row. Each of the plurality of pixel signals may be an analog type pixel signal.

The pixel array 110 may include a color filter array including color filters that pass only a specific wavelength (for example, red, blue, and green) of light incident to each pixel. The pixel signal may represent an intensity of the light of the specific wavelength passing through the color filter array.

In an embodiment of the present disclosure, the pixel signal generated in the pixel array 110 may be amplified through an internal amplifier.

The row decoder 120 may select one row from among a plurality of rows in which the plurality of pixels are arranged in the pixel array 110 in response to an address and control signals output from the controller 130.

The controller 130 may generate control signals for controlling the image sensor 100. The controller 130 may control an open/close operation of switches included in the image sensor 100 by outputting the generated control signal.

The signal transducer 140 may include the internal amplifier that amplifies the pixel signal generated by the pixel array 110. The signal transducer 140 may receive the pixel signals from each of columns of the pixel array 110, and may change a size of the pixel signals according to a gain value of the internal amplifier.

The signal transducer 140 may convert a plurality of analog type pixel signals into a plurality of digital type pixel values. The plurality of digital type pixel values may be output in various patterns. The signal transducer 140 may perform correlated double sampling (CDS) on each of the signals output from the pixel array 110 in response to the control signals output from the controller 130, perform analog-digital conversion on each of the signals on which the CDS is performed, and output each of digital signals.

The signal transducer 140 may include a correlated double sampling (CDS) block and an analog to digital converter (ADC) block. The CDS block may sequentially sample and hold a reference signal and image signal set provided to each of a plurality of column lines included in the pixel array 110. That is, the CDS block may sample and maintain a level of a reference signal and an image signal corresponding to each of columns. The ADC block may output pixel data obtained by converting the correlated double sampling signal for each column output from the CDS block into a digital signal. To this end, the ADC block may include a comparator and a counter corresponding to each column.

The output buffer 150 may be implemented as a plurality of buffers for storing the digital signals output from the signal transducer 140. Specifically, the output buffer 150 may latch and output the pixel data of each column unit provided from the signal transducer 140. The output buffer 150 may store the pixel data output from the signal transducer 140, and sequentially output the pixel data under control of the controller 130. According to an embodiment of the present disclosure, the output buffer 150 may be omitted.

Figure 2:
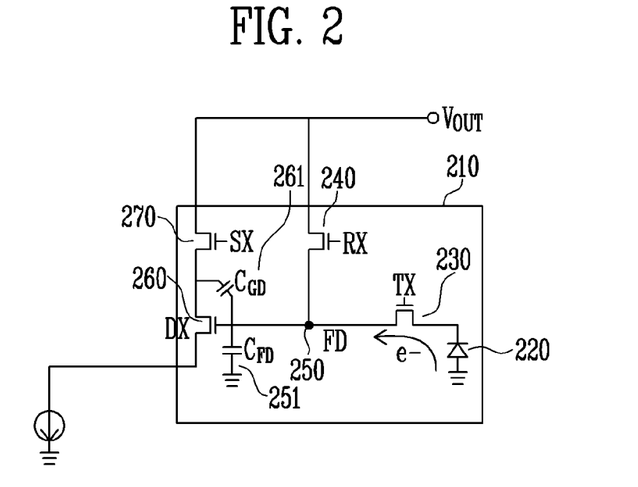
FIG. 2 is a diagram illustrating a pixel included in a pixel array of FIG. 1.

FIG. 2 is a diagram illustrating the pixel included in the pixel array of FIG. 1.

Referring to FIG. 2, the pixel 210 may include a photo sensor 220, a transmission transistor 230, a reset transistor 240, an input transistor 260, and a selection transistor 270. A terminal of the input transistor 260 may be connected to a current source. A terminal of the selection transistor 270 may be connected to an output terminal of the pixel.

The photo sensor 220 may perform a photoelectric conversion function. One terminal of the photo sensor 220 may be connected to a ground. The photo sensor 220 may receive light from the outside and generate a photo charge based on the received light.

The transmission transistor 230 may transmit the photo charge generated by the photo sensor 220 to a floating diffusion node 250 (i.e., FD) in response to a transmission signal TX. During an operation of the transmission transistor 230, the photo charges may be moved to the floating diffusion node 250.

The reset transistor 240 may reset the photo charge accumulated in the floating diffusion node 250 in response to a reset signal RX. During an operation of the reset transistor 240, all photo charges accumulated in the floating diffusion node 250 may be moved. In an embodiment of the present disclosure, a power voltage may be applied to a terminal of the reset transistor. When the power voltage is applied to the floating diffusion node 250, the floating diffusion node 250 may be reset.

The floating diffusion node 250 may be a node in which the photo charge generated by the photo sensor 220 or a charge corresponding to an initial voltage is accumulated. A floating diffusion capacitor 251 may be connected to the floating diffusion node 250. The photo charge may be accumulated in the floating diffusion capacitor $C_{FD}$ 251.

The input transistor 260 may amplify and output a voltage of the floating diffusion node 250. During an operation of the input transistor, a voltage accumulated in the floating diffusion node 250 may be output to the selection transistor 270. A gate of the input transistor 260 may be connected to the floating diffusion node 250, and a source and a drain of the input transistor 260 may be connected between the power voltage and the selection transistor 270. In an embodiment of the present disclosure, the input transistor 260 may be a driving transistor.

In the input transistor 260, a transistor may have a capacitance value corresponding to a gate-drain capacitor. The input transistor 260 may electrically operate as a capacitor in the pixel. In FIG. 2, a gate-drain capacitor 261 may be connected between the gate and the drain of the input transistor 260. In an embodiment the gate-drain capacitor charge may be accumulated in the gate-drain capacitor $C_{GD}$ 261.

The selection transistor 270 may output an output voltage of the input transistor 260 as a signal of the pixel in response to a selection signal SX. During an operation of the selection transistor, a voltage of the floating diffusion node 250 transmitted through the input transistor 260 may be output.

In an embodiment of the present disclosure, an output of the pixel 210 may be transmitted to the signal transducer through the internal amplifier. The output of the pixel 210 may be amplified through the internal amplifier.

Figure 3:
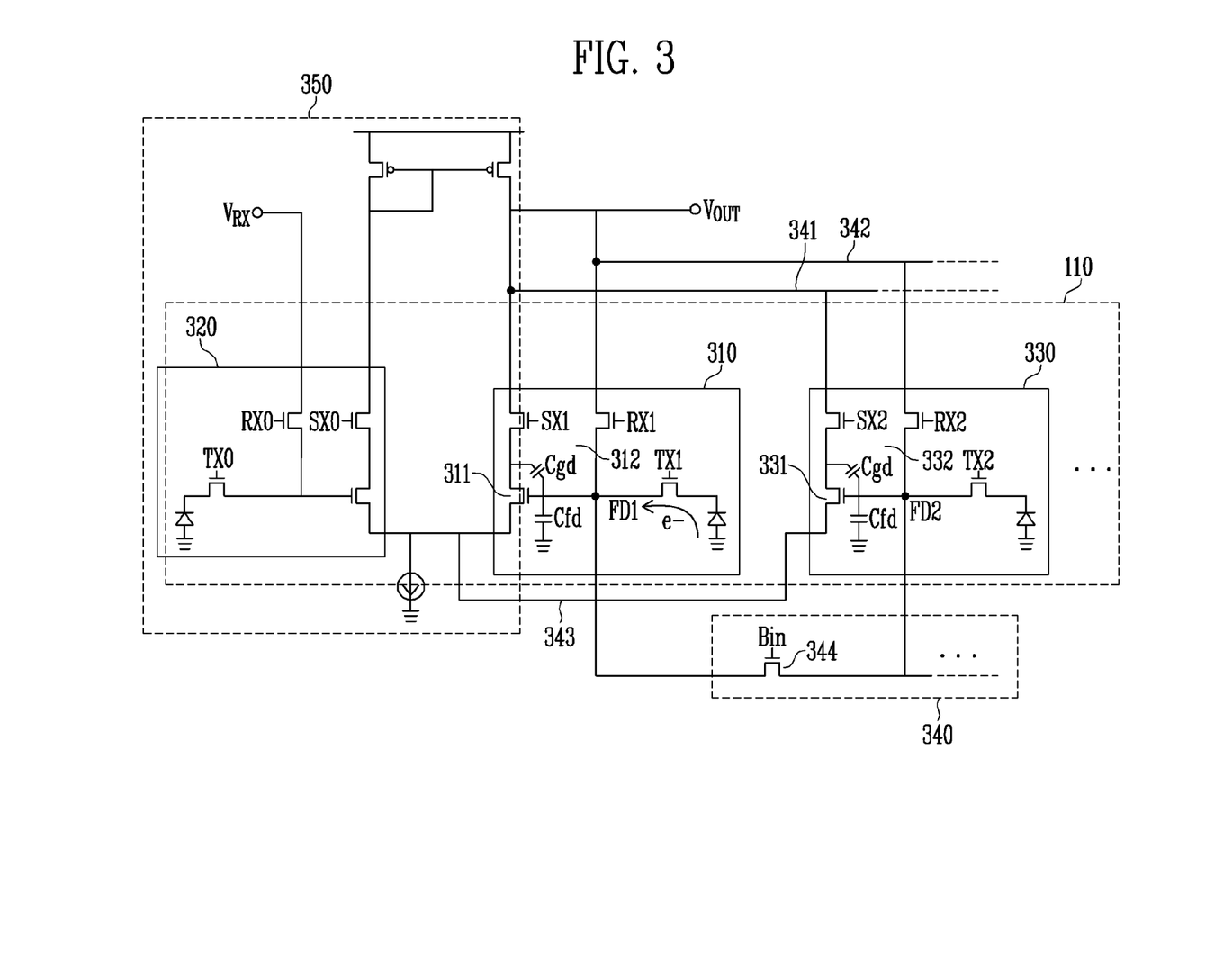
FIG. 3 is a diagram illustrating a portion of a pixel array and an internal amplifier according to an embodiment of the present disclosure.

FIG. 3 is a diagram illustrating a portion of a pixel array and an internal amplifier according to an embodiment of the present disclosure.

Referring to FIG. 3, the image sensor 100 may include the pixel array 110, an internal amplifier 350, and a gain value control switch group 340. An output of a target pixel 310 may be amplified through the internal amplifier 350, and a gain value of the internal amplifier 350 may be adjusted through the gain value control switch group 340. Also in FIG. 3 it is shown, reset signals RX0, RX1, and RX2, selection signals SX0, SX1, and SX2, transmission signals TX0, TX1, and TX2, signal Vout, and signal $V_{RX}$.

The pixel array 110 may include a plurality of pixels 310, 320, and 330. The pixel array 110 may include a plurality of pixels 210 described with reference to FIG. 2. The pixel array 110 may include a target pixel 310 outputting a signal, a reference pixel 320 included in the internal amplifier 350, and a dummy pixel 330 to which the target pixel 310 and the floating diffusion node are connected. A plurality of pixels may be arranged in a row direction and a column direction in the pixel array 110.

In an embodiment of the present disclosure, the plurality of pixels included in the pixel array 110 may be connected through common lines. The common lines may be connected to one end of a transistor included in each of the pixels. One end of the common line may be connected to the power voltage or may be connected to an output terminal of the pixel. In FIG. 3, the target pixel 310 and the dummy pixel 330 may be connected through common lines 341, 342, and 343.

The internal amplifier 350 may amplify the signal of the target pixel 310 selected from among the plurality of pixels. The internal amplifier 350 may be connected to each column line of the pixel array 110. A column address of the pixels connected to the internal amplifier 350 may be the same. In an embodiment of the present disclosure, the column line may be meant a common line.

In an embodiment of the present disclosure, the internal amplifier 350 may amplify the signal of the target pixel 310 based on a comparison result of comparing a signal of the target pixel 310 and the signal of the reference pixel 320 among the pixels of which a column address is the same as the target pixel 310.

The gain value control switch group 340 may include at least one switch 344 connecting the target pixel 310 and the floating diffusion node of the dummy pixel 330. In an embodiment of the present disclosure, when the switch 344 is closed, the target pixel 310 and the dummy pixel 330 may be connected in parallel. The gain value control switch group 340 may adjust a gain value of the internal amplifier 350.

In an embodiment of the present disclosure, the input transistor of the pixels may have a capacitance value corresponding to the gate-drain capacitor. That is, the pixels may include the gate-drain capacitor corresponding to the input transistor.

In an embodiment of the present disclosure, the gain value control switch group 340 may include switches connecting between the floating diffusion nodes of the pixels of which the column address is the same. When the switches included in the gain value control switch group 340 are closed, equivalent gate-drain capacitors 312 and 332 of the input transistors 311 and 331 of the target pixel 310 and the dummy pixels may be connected in parallel. When the number of capacitors connected in parallel is increased, a total capacitance value may be increased.

When the number of dummy pixels connected with the target pixel 310 in parallel is increased, a capacitance value of the equivalent gate-drain capacitor corresponding to the input transistor of the composite pixel to which the target pixel 310 and the dummy pixels are connected in parallel may be increased. In an embodiment of the present disclosure, the gain value of the internal amplifier 350 may be inversely proportional to the capacitance value of the equivalent gate-drain capacitor. That is, as the number of dummy pixels connected to the target pixel in parallel is increased, the gain value of the internal amplifier 350 may be decreased.

The controller 130 may output control signals for controlling the switches included in the gain value control switch group 340. The controller 130 may control an open/close operation of the switches included in the gain value control switch group 340.

In an embodiment of the present disclosure, the number of dummy pixels 330 may be plural. The controller 130 may determine the number of dummy pixels based on a size of the signal of the target pixel. The controller 130 may determine the determined number of dummy pixels from among candidate pixels connected to the target pixel 310 through the common lines 341, 342, and 343. In an embodiment, candidate pixels are pixels positioned on the same common line as the target pixel.

The controller 130 may transmit an operation signal only to the switch 344 corresponding to the dummy pixel 330. The controller 130 may generate a control signal for activating only the switch 344 corresponding to the dummy pixel 330. For example, the switch 344 corresponding to the dummy pixel 330 may be shorted. Remaining switches other than the switch 344 corresponding to the dummy pixel 330 may be maintained in an open state.

In an embodiment of the present disclosure, the switch may be implemented as a transistor. A control signal '1' may be applied to a gate of a transistor corresponding to the dummy pixel 330. The transistor to which the control signal '1' is applied may be shorted to connect the target pixel and the dummy pixel. The transistor to which a control signal '0' is applied may maintain an open state.

In an embodiment of the present disclosure, the gain value of the internal amplifier 350 may be decreased as the number of dummy pixels to be connected to the target pixel 310 is increased. The controller 130 may adjust the gain value of the internal amplifier 350 by adjusting the number of dummy pixels connected to the target pixel 310. For example, the controller 130 may decrease the gain value of the internal amplifier 350 by increasing the number of dummy pixels connected to the target pixel 310 in parallel.

In FIG. 3, for convenience of description, a case where one dummy pixel 330 exists may be assumed. The signal of the target pixel 310 may be amplified and output by comparing the signal of the target pixel 310 with the signal of the reference pixel 320. The target pixel 310 may be connected with the dummy pixel 330 in parallel.

The target pixel 310 may be connected to the dummy pixel 330 in parallel through the common lines 341, 342, 343 and the switch 344. In FIG. 3, it may be assumed that characteristics of the target pixel 310, the reference pixel 320, and the dummy pixel 330 are the same.

In an embodiment of the present disclosure, the pixels may include a photo sensor, a transmission transistor, a reset transistor, an input transistor, and a selection transistor. A drain of the selection transistor of the target pixel 310 and a drain of the selection transistor of the dummy pixel 330 may be connected to a first line 341. A drain of the reset transistor of the target pixel 310 and a drain of the reset transistor of the dummy pixel 330 may be connected to a second line 342. A source of the input transistor of the target pixel 310 and a source of the input transistor of the dummy pixel 330 may be connected to a third line 343. A floating diffusion node FD1 of the target pixel 310 and a floating diffusion node FD2 of the dummy pixel may be connected through the switch 344.

In an embodiment of the present disclosure, the common lines may include the first line 341, the second line 342, and the third line 343. Pixels in which one end of a transistor included in the target pixel 310 is connected to the same common line may be determined as the dummy pixel 330.

The controller 130 may transmit a control signal Bin to the switch 344. In an embodiment of the present disclosure, the switch 344 may be implemented as a transistor. When the switch 344 operates, a short state may occur, and thus the floating diffusion node FD1 of the target pixel 310 and the floating diffusion node FD2 of the dummy pixel 330 may be connected. In an embodiment of the present disclosure, a control signal '1' may be applied to a gate of the switch 344. The switch 344 to which the control signal '1' is applied may be activated.

One end of the same type of transistors may be connected to the target pixel 310 and the dummy pixel 330 through the common lines 341, 342, and 343, and a floating diffusion node may be connected. That is, the target pixel 310 and the dummy pixel 330 may be connected in parallel.

The gain value of the internal amplifier when the dummy pixel 330 is not connected to the target pixel 310 may be expressed as the following equation.

$$\text{Gain} = \frac{e}{\frac{(Cfd + Cgd)}{A} + Cgd} \approx \frac{e}{Cgd}$$

Here, e is a charge amount, Cfd is a capacitance value of the floating diffusion capacitor, Cgd is a capacitance value of the gate-drain capacitor of the input transistor, and A is an open loop gain of the internal amplifier.

The gain value of the internal amplifier may be inversely proportional to the capacitance value of the gate-drain capacitor of the input transistor.

In an embodiment of the present disclosure, the gain value of the internal amplifier when the target pixel 310 and the dummy pixel 330 are connected in parallel may be expressed as the following equation.

$$\text{Gain} = \frac{e}{\frac{(2Cfd + 2Cgd)}{A} + 2Cgd} \approx \frac{e}{2Cgd}$$

It may be seen that the gain value of the internal amplifier is reduced by half. Since the target pixel 310 and the dummy pixel 330 are electrically connected in parallel, a capacitance value corresponding to the input transistor may be doubled. That is, the equivalent capacitance value of the gate-drain capacitor corresponding to the input transistor of the composite pixel in which the target pixel 310 and the dummy pixel 330 are connected in parallel may be doubled.

In an embodiment of the present disclosure, when the controller connects an additional dummy pixel to the target pixel 310 in parallel, the gain value of the internal amplifier may be further decreased.

Figure 4:
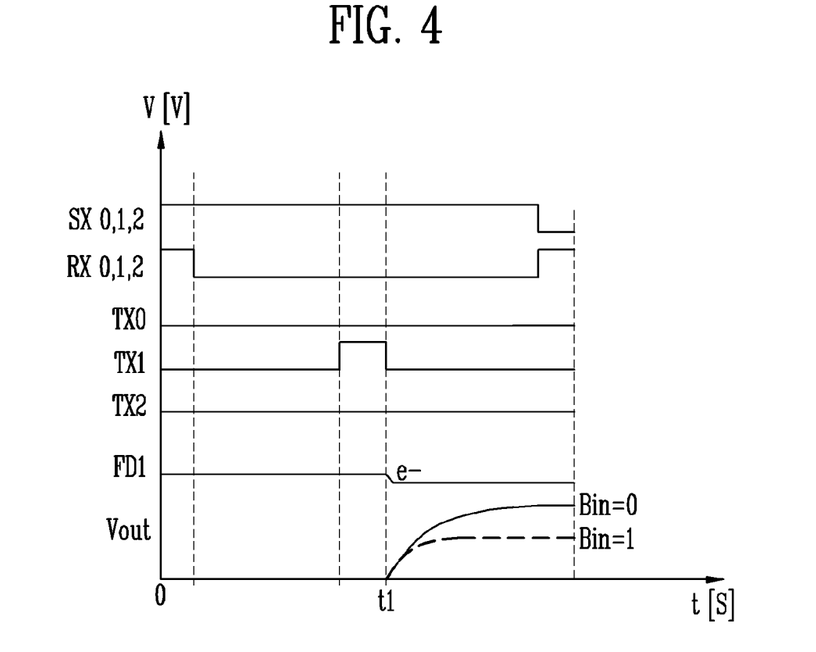
FIG. 4 is a diagram illustrating a signal input to transistors and a signal of a target pixel according to an embodiment of the present disclosure.

FIG. 4 is a diagram illustrating a signal input to transistors and a signal of a target pixel according to an embodiment of the present disclosure.

Referring to FIG. 4, a change of signals applied to the target pixel 310, the reference pixel 320, and the dummy pixel 330 shown in FIG. 3, and a potential change and a change of a signal of the floating diffusion node FD1 of the target pixel 310 is shown.

In FIG. 4, while a read operation of the target pixel 310 is performed, a high signal may be applied to the selection transistors of each of the target pixel 310, the reference pixel 320, and the dummy pixel 330. A high signal may be applied to the reset transistors of each of the target pixel 310, the reference pixel 320, and the dummy pixel 330 only at an initial stage of the read operation.

In order to read the photo charge generated by the photo sensor of the target pixel 310, a high signal may be applied only to the transmission transistor of the target pixel 310. In an embodiment of the present disclosure, a high signal may be applied to the transmission transistor of the target pixel 310 from a predetermined time to t1. Since the photo charge is generated only by the photo sensor of the target pixel 310, a potential of the floating diffusion node of the target pixel 310 may be decreased by a potential corresponding to the photo charge after t1. The word "predetermined" as used herein with respect to a parameter, such as a predetermined time and reference value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

A voltage of the floating diffusion node of the target pixel 310 may be applied to the gate of the input transistor of the target pixel 310. Since the input transistor of the target pixel 310 generates a signal corresponding to the voltage of the floating diffusion node, and the high signal is applied to the selection transistor of the target pixel 310, a signal Vout of the target pixel may be detected after t1.

In FIG. 4, Bin=0 may mean the control signal '0' applied to the switch 344 corresponding to the dummy pixel 330. When the control signal '0' is applied to the switch 344, the switch 344 may maintain an open state. That is, when Bin=0, the dummy pixel 330 may not be connected to the target pixel 310.

In FIG. 4, Bin=1 may mean the control signal '1' applied to the switch 344 corresponding to the dummy pixel 330. When the control signal '1' is applied to the switch 344, the switch 344 may maintain a short state. That is, when Bin=1, the target pixel 310 and the dummy pixel 330 may be connected in parallel.

In an embodiment of the present disclosure, when the dummy pixel 330 is connected to the target pixel 310 in parallel, a size of the signal Vout of the target pixel 310 may be decreased. It may be seen that when the target pixel 310 and the dummy pixel 330 are electrically connected in parallel, the gain value of the internal amplifier is decreased.

Figure 5:
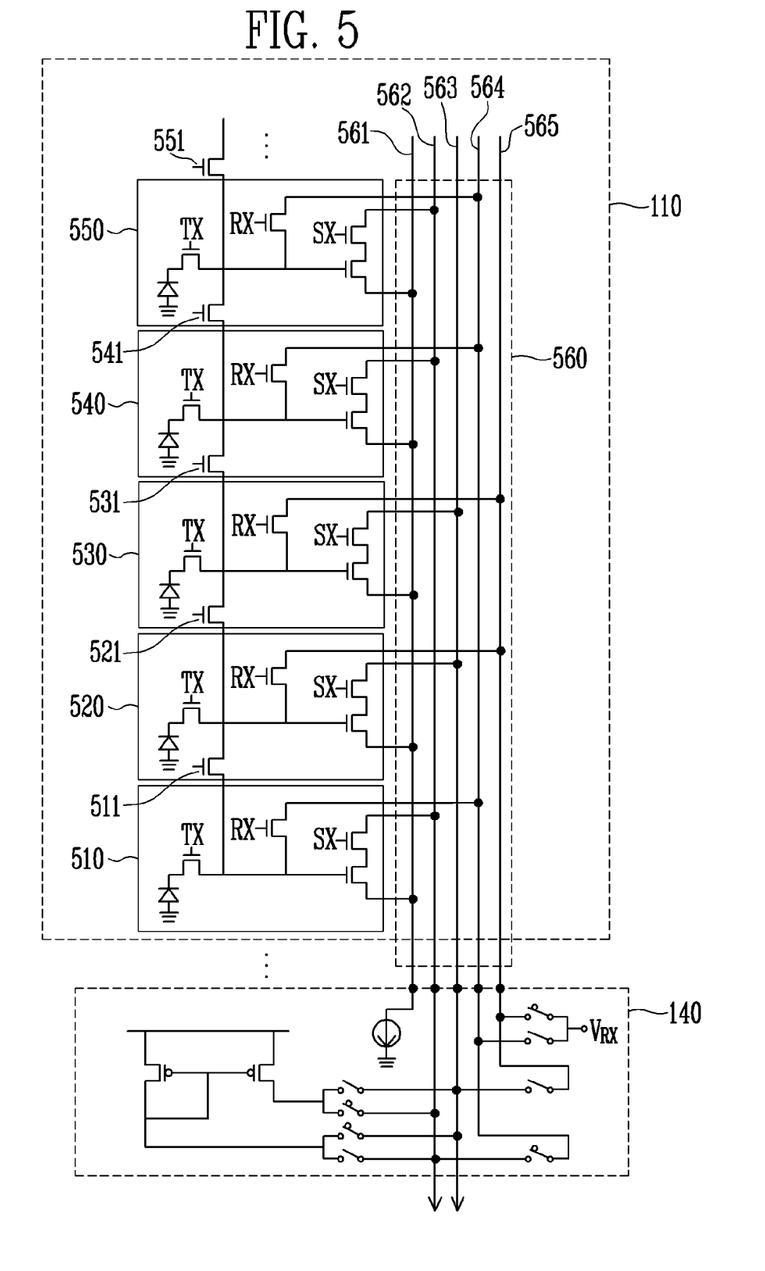
FIG. 5 is a diagram illustrating candidate pixels and a dummy pixel according to an embodiment of the present disclosure.

FIG. 5 is a diagram illustrating candidate pixels and a dummy pixel according to an embodiment of the present disclosure.

Referring to FIG. 5, pixels 510, 520, 530, 540, and 550 of which a column address is the same may be connected through common lines 560. The pixels 510, 520, 530, 540, and 550 of which the column address is the same may be included in the pixel array 110. FIG. 5 illustrates, for example, the pixels of which the column address is the same among the pixels included in the pixel array. In FIG. 5, the target pixel, the reference pixel, and the dummy pixel may be determined according to the read operation. The signal transducer 140 may amplify the signal of the target pixel by comparing the signals of the target pixel and the reference pixel.

In FIG. 5, the common lines 560 may include a first line 561, a second line 562, a third line 563, a fourth line 564, and a fifth line 565. The pixels 510, 520, 530, 540, and 550 of which the column address is the same may be connected to the first line 561, the second line 562, the third line 563, the fourth line 564, and the fifth line 565.

The pixels 510, 520, 530, 540, and 550 of which the column address is the same may be classified into a first group or a second group according to the connected common lines 560. For example, the pixels 510, 540, and 550 connected to the first line 561, the second line 562, and the fourth line 564 may be included in the first group. Similarly, the pixels 520 and 530 connected to the first line 561, the third line 563, and the fifth line 565 may be included in the second group.

In FIG. 5, the first line 561 may be connected to a source of input transistors of the pixels 510, 520, 530, 540, and 550 of which the column address is the same. The first line 561 may be connected to a current source.

The second line 562 may be connected to a drain of selection transistors of the pixels 510, 540, and 550. When the target pixel exists among the pixels 510, 540, and 550, a signal may be output from the second line 562.

The third line 563 may be connected to a drain of selection transistors of the pixels 520 and 530. When the target pixel exists among the pixels 520 and 530, the signal may be output from the third line 563.

The fourth line 564 may be connected to a drain of reset transistors of the pixels 510, 540, and 550. The pixels 510, 540, and 550 may be classified into the first group according to the lines 561, 562, and 564 to which the pixels 510, 540, and 550 are connected among the common lines 560.

The fifth line 565 may be connected to a drain of reset transistors of the pixels 520 and 530. The pixels 520 and 530 may be classified into the second group according to the lines 561, 563, and 565 to which the pixels 520 and 530 are connected among the common lines 560.

In FIG. 5, floating diffusion nodes of the pixels 510, 520, 530, 540, and 550 of which the column address is the same may be connected to floating diffusion nodes of neighboring pixels through switches 511, 521, 531, 541, and 551. In an embodiment of the present disclosure, the floating diffusion nodes of the pixels 510 and 520 may be connected through the switch 511. The floating diffusion nodes of the pixels 520 and 530 may be connected through the switch 521. The floating diffusion nodes of the pixels 530 and 540 may be connected through the switch 531. The floating diffusion nodes of the pixels 540 and 550 may be connected through the switch 541.

In an embodiment of the present disclosure, the pixel 520 may be assumed as the target pixel, and the pixel 510 may be assumed as the reference pixel. Since the target pixel is the second group, the remaining pixel 530 of the second group may be determined as the dummy pixel. The controller may transmit the control signal '1' only to the switch 521 and transmit the control signal '0' to the remaining switches 511, 531, 541, and 551. Only the switch 521 may be changed to a short state and the remaining switches 511, 531, 541, and 551 may be changed to an open state. The switch 521 may be activated, and thus the pixel 520 and the pixel 530 may be connected in parallel.

In another embodiment of the present disclosure, the pixel 540 may be assumed as the target pixel, and the pixel 520 may be assumed as the reference pixel. Since the target pixel is the first group, the remaining pixels 510 and 550 of the first group may be determined as the dummy pixels. However, the pixel 550 may be determined as the dummy pixel due to a position of the switches 511, 521, 531, 541, and 551 connected to the target pixel.

Figure 6:
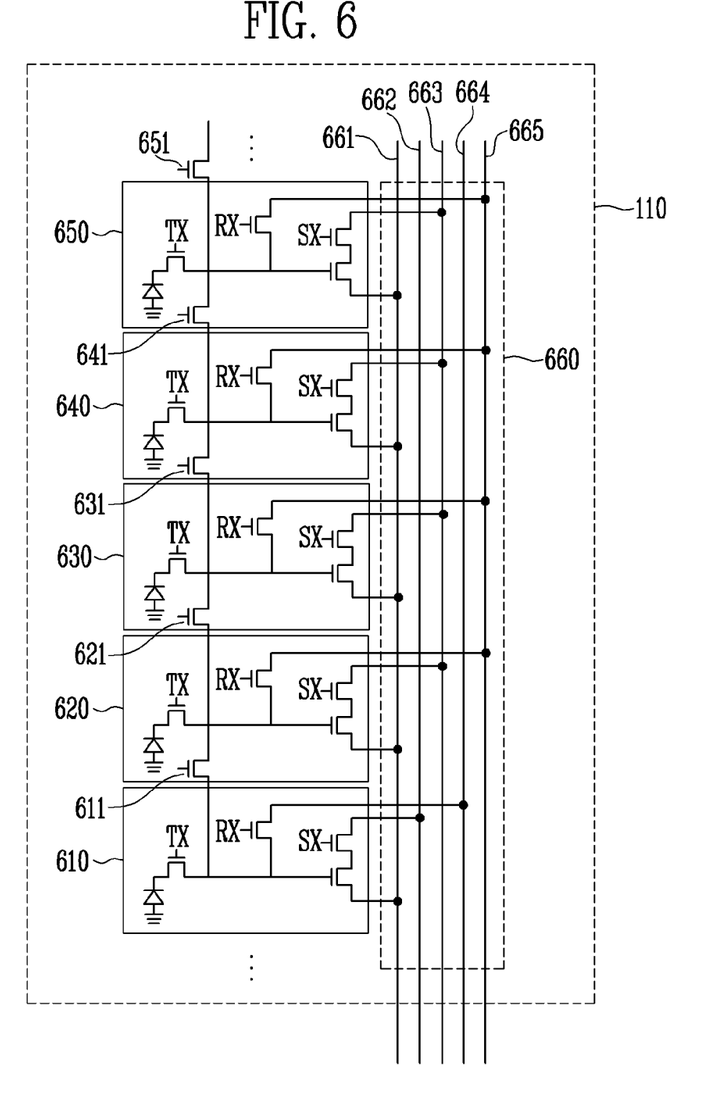
FIG. 6 is a diagram illustrating a plurality of dummy pixels according to still another embodiment of the present disclosure.

FIG. 6 is a diagram illustrating a plurality of dummy pixels according to still another embodiment of the present disclosure.

Referring to FIG. 6, a pixel array 110 including a plurality of pixels connected through common lines 660 may be shown. In FIG. 6, pixels connected to any column line of the pixel array 110 may be shown. A reference pixel 610 and a target pixel 620 among the plurality of pixels may be assumed for convenience of description. In FIG. 6, pixels 620, 630, 640, and 650 may be connected to the same lines 661, 663, and 665. In FIG. 6, the common lines 660 may include a plurality of lines 661, 662, 663, 664, and 665. Floating diffusion nodes of the pixels 610, 620, 630, 640, and 650 of a column address is the same may be connected to floating diffusion nodes of neighboring pixels through switches 611, 621, 631, 641, and 651.

A dummy pixel may be determined among remaining pixels 630, 640, and 650 of a pixel group except for a target pixel 620. The number of dummy pixels may vary according to the gain value of the internal amplifier. That is, all of the remaining pixels 630, 640, and 650 of the pixel group may be determined as the dummy pixels, or only a portion of the remaining pixels 630, 640, and 650 of the pixel group may be determined as the dummy pixel.

In an embodiment of the present disclosure, the dummy pixel 630 corresponding to the target pixel 620 may be assumed. The controller may transmit a control signal for activating the switches 621 corresponding to the dummy pixel 630. The switches 621 corresponding to the dummy pixel 630 may be changed to a short state. The target pixel 620 and the dummy pixel 630 may be electrically connected in parallel.

The controller may additionally change the gain value of the internal amplifier. For example, the controller may connect an additional dummy pixel to the target pixel 620 in parallel in response to the gate-drain capacitance value of the input transistor of the composite pixel to which the target pixel 620 and the dummy pixels 630 are connected in parallel being less than or equal to a predetermined reference value. The controller may generate and output an additional control signal for increasing the number of dummy pixels.

The controller may determine that all of the remaining pixels 640 and 650 of the pixel group are additional dummy pixels. The controller may change the switches 631 and 641 corresponding to the additional dummy pixels 640 and 650 to a short state. The gain value of the internal amplifier may be decreased corresponding to a parallel connection of the composite pixel and the additional dummy pixels 640 and 650. As the number of dummy pixels connected in parallel to the target pixel 620 is increased, the gain value of the internal amplifier may further be decreased.

Figure 7:
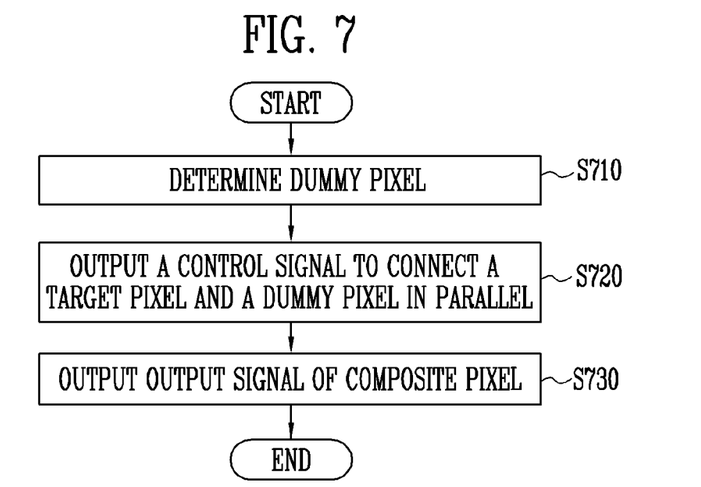
FIG. 7 is a flowchart illustrating a method of adjusting a gain value of an internal amplifier according to an embodiment of the present disclosure.

FIG. 7 is a flowchart illustrating a method of adjusting a gain value of an internal amplifier according to an embodiment of the present disclosure.

Referring to FIG. 7, the image sensor may adjust the gain value of the internal amplifier by connecting the dummy pixel to the target pixel in parallel. The gain value of the internal amplifier may vary according to the number of dummy pixels connected to the target pixel in parallel. As the number of dummy pixels increases, the gain value of the internal amplifier may be decreased.

In step S710, the controller may determine the dummy pixel of which the column address is the same as the target pixel based on the common lines connected to the determined target pixel among the pixels included in the pixel array. In the target pixel and the dummy pixel, one end of the same type of transistors is connected through the common lines, and the floating diffusion node may be connected through the switch.

The controller may determine the dummy pixel in which the drain of the selection transistors of the dummy pixel and the drain of the selection transistor of the target pixel are connected to the first line, the drain of the reset transistor of the dummy pixel and the drain of the reset transistor of the target pixel are connected to the second line, and the source of the input transistor of the dummy pixel and the source of the input transistor of the target pixel are connected to the third line among the pixels. The common lines may include the first line, the second line, and the third line.

The controller may connect the target pixel and at least one or more dummy pixels connected through the common line in parallel. In an embodiment of the present disclosure, the controller may include switches that connect each of the candidate pixels of which a column line is the same as the target pixel with the target pixel in parallel. The controller may determine at least one or more dummy pixels from among the candidate pixels. The controller may control the switches corresponding to each of the one or more dummy pixels. The controller may transmit the operation signal only to the switch corresponding to the dummy pixel.

The controller may determine the number of dummy pixels to be connected to the target pixel according to the gain value of the internal amplifier. In an embodiment of the present disclosure, the gain value of the internal amplifier may be decreased as the number of dummy pixels to be connected to the target pixel increases. The controller may adjust the gain value of the internal amplifier according to a change of the number of dummy pixels connected to the target pixel. The controller may decrease the gain value of the internal amplifier by increasing the number of dummy pixels connected to the target pixel in parallel.

The controller may determine the candidate pixels connected to the same common lines as the target pixel as the dummy pixels. In another embodiment of the present disclosure, the controller may determine the dummy pixel connected to the target pixel in parallel, and additionally may connect the additional dummy pixel to the target pixel in parallel.

In step S720, the controller may connect the target pixel and the dummy pixel in parallel. In an embodiment of the present disclosure, the controller may generate the control signal that activates only the switch corresponding to the dummy pixel. For example, the controller may operate the switch corresponding to the dummy pixel to be in a short state. The switches except for the switch corresponding to the dummy pixel may be maintained in an open state.

The controller may connect the floating diffusion node connecting the input transistor of the target pixel and the photo sensor to the floating diffusion node connecting the input transistor of the dummy pixel and the photo sensor.

In an embodiment of the present disclosure, the switch connecting the target pixel and the dummy pixel may connect the floating diffusion node of the target pixel and the floating diffusion node of the dummy pixel. The controller may determine at least one or more dummy pixels from among the candidate pixels according to lines connected to the target pixel among the common lines. In an embodiment of the present disclosure, the drain of the selection transistor of the dummy pixels may be connected to the same line as the drain of the selection transistor of the target pixel. The drain of the reset transistor of the dummy pixels may be connected to the same line as the drain of the reset transistor of the target pixel. The source of the input transistor of the dummy pixels may be connected to the same line as the source of the input transistor of the target pixel.

In step S730, the internal amplifier may output a signal of the target pixel of which a gain value is adjusted. The controller may adjust the gain value of the internal amplifier based on the number of dummy pixels connected to the target pixel in parallel.

The controller may convert the target pixel into the composite pixel in which the target pixel and the dummy pixel are connected in parallel. The controller may decrease the gain value of the internal amplifier in response to the conversion of the composite pixel.

In an embodiment of the present disclosure, the capacitance value of the equivalent gate-drain capacitor of the input transistor of the composite pixel may be greater than the capacitance value of the gate-drain capacitor of the input transistor of the target pixel. The controller may determine additional dummy pixels for additionally adjusting the gain value of the internal amplifier. The controller may output a signal for connecting the target pixel and the additional dummy pixels in parallel to the switches.

Since the gain value of the internal amplifier amplifying the signal of the target pixel is determined in a process step, it may be difficult to adjust the gain value. In an embodiment of the present disclosure, when the read operation of the target pixel is performed, the gain value of the internal amplifier may be adjusted without adding a separate capacitor by connecting the dummy pixel with the target pixel in parallel.

Figure 8:
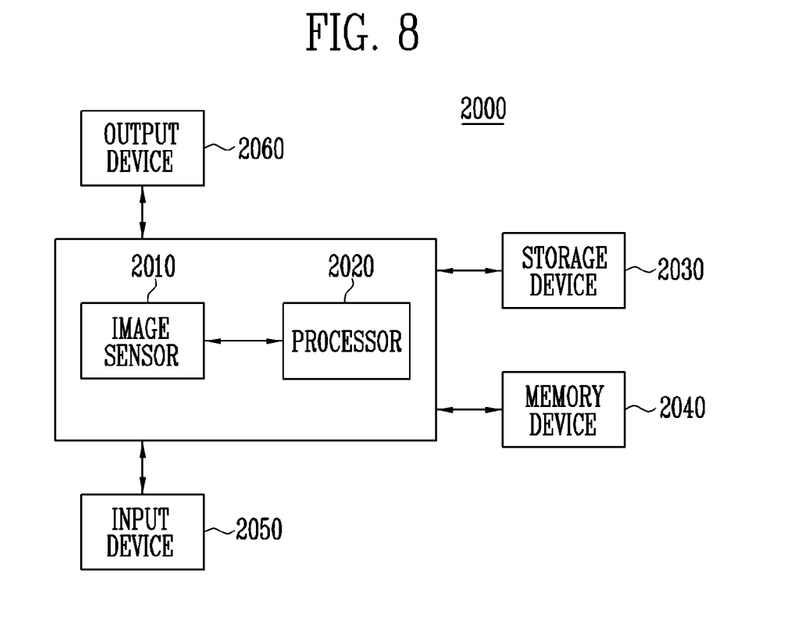
FIG. 8 is a block diagram illustrating an electronic device including an image sensor according to an embodiment of the present disclosure.

FIG. 8 is a block diagram illustrating an electronic device including an image sensor according to an embodiment of the present disclosure.

Referring to FIG. 8, the electronic device 2000 may include an image sensor 2010, a processor 2020, a storage device 2030, a memory device 2040, an input device 2050, and an output device 2060. Although not shown in FIG. 8, the electronic device 2000 may further include ports capable of communicating with a video card, a sound card, a memory card, a USB device, or the like, or communicating with other electronic devices.

The image sensor 2010 may generate image data corresponding to incident light. The image data may be transferred to and processed by the processor 2020. The image sensor 2010 may generate image data for an object input (or captured) through a lens. The lens may include at least one lens forming an optical system.

The image sensor 2010 may include a plurality of pixels. The image sensor 2010 may generate a plurality of pixel values corresponding to the captured image in a plurality of pixels. The plurality of pixel values generated by the image sensor 2010 may be transmitted to the processor 2020. That is, the image sensor 2010 may generate a plurality of pixel values corresponding to a single frame.

In an embodiment of the present disclosure, the image sensor 2010 may control the open/close operation of the switches connecting the floating diffusion node of the dummy pixel of which the column address is the same as the target pixel to adjust the gain value of the internal amplifier. The image sensor 2010 may determine the number of dummy pixels connected to the target pixel in parallel based on the size of the signal of the target pixel. The image sensor 2010 may generate the pixel signal in response to various illuminances by adjusting the gain value of the internal amplifier.

The output device 2060 may display the image data. The storage device 2030 may store the image data. The processor 2020 may control operations of the image sensor 2010, the output device 2060, and the storage device 2030.

The processor 2020 may be an image processing device that performs an operation of processing the pixel data received from the image sensor 2010 and outputs the processed image data. Here, the processing may be electronic image stabilization (EIS), interpolation, color tone correction, image quality correction, size adjustment, or the like.

The processor 2020 may be implemented as a chip independent of the image sensor 2010. For example, the processor 2020 may be implemented as a multi-chip package. In another embodiment of the present disclosure, the processor 2020 may be included as a part of the image sensor 2010 and implemented as a single chip.

The processor 2020 may execute and control an operation of the electronic device 2000. According to an embodiment of the present disclosure, the processor 2020 may be a microprocessor, a central processing unit (CPU), or an application processor (AP). The processor 2020 may be connected to the storage device 2030, the memory device 2040, and the input device 2050 through an address bus, a control bus, and a data bus to perform communication.

The storage device 2030 may include a flash memory device, a solid state drive (SSD), a hard disk drive (HDD), a CD-ROM, and all types of nonvolatile memory devices.

The memory device 2040 may store data required for the operation of the electronic device 2000. For example, the memory device 2040 may include a volatile memory device such as a dynamic random access memory (DRAM) or a static random access memory (SRAM) and a nonvolatile memory device such as an erasable programmable read-only memory (EPROM), an electrically erasable programmable read-only memory (EEPROM), and a flash memory device. The processor 2020 may execute a command set stored in the memory device 2040 to control the image sensor 2010 and the output device 2060.

The input device 2050 may include an input means such as a keyboard, a keypad, and a mouse, and the output device 2060 may include an output means such as a printer and a display.

The image sensor 2010 may be implemented as various types of packages. For example, at least some configurations of the image sensor 2010 may be implemented using packages such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Meanwhile, the electronic device 2000 may be interpreted as all computing systems using the image sensor 2010. The electronic device 2000 may be implemented in a form of a packaged module, a part, or the like. For example, the electronic device 2000 may be implemented as a digital camera, a mobile device, a smart phone, a personal computer (PC), a tablet personal computer (PC), a notebook computer, a personal digital assistant (PDA), an enterprise digital assistant (EDA), a portable multimedia player (PMP), a wearable device, a black box, a robot, an autonomous vehicle, or the like.

The scope of the present disclosure is indicated by the claims to be described later rather than the detailed description, and all changes or modifications derived from the meaning and scope of the claims and their equivalent concepts are interpreted as being included in the scope of the present disclosure.

What is claimed is:

1. An image sensor comprising:
a pixel array including a plurality of common lines to which a plurality of pixels are connected;
an internal amplifier configured to amplify a signal of a target pixel selected from among the plurality of pixels;
switches configured to control a connection between a floating diffusion node of the target pixel and respective floating diffusion nodes of candidate pixels; and
a controller configured to output control signals for controlling the switches,
wherein the candidate pixels are positioned on the same common line as the target pixel, and
wherein the internal amplifier compares a signal of a reference pixel and the signal of the target pixel, the reference pixel positioned on the same common line as the target pixel.

2. The image sensor of claim 1, wherein the internal amplifier outputs a signal having a size determined based on a number of respective floating diffusion nodes of dummy pixels connected to the floating diffusion node of the target pixel, and wherein at least one or more of the candidate pixels are the dummy pixels.

3. The image sensor of claim 2, wherein the controller outputs a first control signal for increasing the number of respective floating diffusion nodes of the dummy pixels connected to the floating diffusion node of the target pixel.

4. The image sensor of claim 2, wherein the controller outputs a second control signal for reducing the number of respective floating diffusion nodes of the dummy pixels connected to the floating diffusion node of the target pixel.

5. The image sensor of claim 1, wherein each of the plurality of pixels includes a photo sensor that generates a photo charge based on received light, a transmission transistor that connects the photo sensor and a floating diffusion node of the pixel including the transmission transistor, a reset transistor that resets a charge accumulated in the floating diffusion node of the pixel including the transmission transistor, an input transistor that has a gate connected to the floating diffusion node of the pixel including the transmission transistor, and a selection transistor that outputs a voltage of the input transistor.

6. The image sensor of claim 5, wherein in each of the candidate pixels, a drain of a selection transistor of the target pixel is connected to a drain of a selection transistor, a drain of a reset transistor of the target pixel is connected to a drain of a reset transistor, and a source of an input transistor of the target pixel and a source of an input transistor are connected.

7. The image sensor of claim 6, wherein the controller generates the control signals for controlling an open and close operation of each of the switches based on a size of the signal of the target pixel.

8. The image sensor of claim 7, wherein the internal amplifier adjusts a size of an output signal based on a number of respective floating diffusion nodes of dummy pixels to which the target pixel and the floating diffusion node are connected according to the control signals.

9. An image sensor comprising:
pixels including a photo sensor configured to generate a photo charge based on received light, an input transistor configured to generate a signal based on the photo charge, and a floating diffusion node connecting the photo sensor and the input transistor;
an internal amplifier configured to amplify signals of the pixels;
switches configured to connect between floating diffusion nodes of candidate pixels having the same column address among the pixels; and
a controller configured to determine a target pixel from which a signal is output from among the pixels and at least one or more dummy pixels to which the floating diffusion node is connected, and adjust a gain value of the internal amplifier.

10. The image sensor of claim 9, wherein the controller generates a control signal for operating target switches connected to the one or more dummy pixels among the switches.

11. The image sensor of claim 10, wherein the controller determines a number of the one or more dummy pixels to which the floating diffusion node is connected based on a size of the signal of the target pixel.

12. The image sensor of claim 11, wherein the internal amplifier receives a signal from a composite pixel in which the target pixel and the one or more dummy pixels are connected in parallel, and
the controller adjusts an equivalent gate-drain capacitance value of an input transistor of the composite pixel in relation to the gain value.

13. The image sensor of claim 12, wherein the equivalent gate-drain capacitance value is determined based on the number of the one or more dummy pixels to which the floating diffusion node is connected.

14. The image sensor of claim 13, wherein the equivalent gate-drain capacitance value is increased in response to an increase of a number of dummy pixels connected to the target pixel in parallel.

15. The image sensor of claim 12, wherein the controller outputs an additional control signal for increasing the number of the one or more dummy pixels to which the floating diffusion node is connected in response to the equivalent gate-drain capacitance value being less than or equal to a predetermined reference value.

16. A method of operating an image sensor, the method comprising:
determining a dummy pixel whose floating diffusion node is connected to a floating diffusion node of a target pixel outputting a signal among pixels included in a pixel array;
outputting a control signal to a switch for controlling a connection between the dummy pixel and the target pixel; and
outputting a signal of a first composite pixel to which the target pixel and the dummy pixel are connected.

17. The method of claim 16, wherein determining the dummy pixel comprises determining the dummy pixel from among candidate pixels connected to the target pixel by common lines.

18. The method of claim 17, wherein the common lines include a first line to which a drain of a selection transistors of each of the candidate pixels and a drain of a selection transistor of the target pixel are connected, a second line to which a drain of a reset transistor of each of the candidate pixels and a drain of a reset transistor of the target pixel are connected, and a third line to which a source of an input transistor of each of the candidate pixels and a source of an input transistor of the target pixel are connected.

19. The method of claim 18, further comprising:
determining an additional dummy pixel among the candidate pixels in response to an equivalent gate-drain capacitance value of an input transistor of the first composite pixel being less than or equal to a predetermined reference value;
outputting an additional control signal for operating a switch connected to the additional dummy pixel; and
outputting a signal of a second composite pixel to which the additional dummy pixel and the first composite pixel are connected.

* * * * *